United States Patent
Koerner et al.

(10) Patent No.: US 6,898,847 B2
(45) Date of Patent: May 31, 2005

(54) METHOD FOR PRODUCING AN ELECTRICAL CONNECTION BETWEEN A PLUG ELEMENT AND A PRINTED CIRCUIT BOARD

(75) Inventors: André Koerner, Lippstadt (DE); Ralf Schulze, Lippstadt (DE)

(73) Assignee: Hella KG Hueck & Co., Lippstadt (DE)

( * ) Notice: Subject to any disclaimer, the term of this patent is extended or adjusted under 35 U.S.C. 154(b) by 155 days.

(21) Appl. No.: 10/193,989

(22) Filed: Jul. 15, 2002

(65) Prior Publication Data

US 2003/0024114 A1 Feb. 6, 2003

(30) Foreign Application Priority Data

Jul. 14, 2001 (DE) .......................................... 101 34 379

(51) Int. Cl.[7] .................................................. H05K 3/34
(52) U.S. Cl. ............................ 29/840; 29/825; 29/832; 29/842; 29/843; 228/180.1; 228/180.22
(58) Field of Search .......................... 29/825, 830, 832, 29/840, 842, 843, 852, 846; 228/180.1, 180.22; 361/771, 777

(56) References Cited

U.S. PATENT DOCUMENTS

| | | | |
|---|---|---|---|
| 4,700,276 A | * | 10/1987 | Freyman et al. ............ 361/771 |
| 4,774,760 A | | 10/1988 | Seaman et al. |
| 5,796,589 A | * | 8/1998 | Barrow ........................ 361/774 |
| 5,875,102 A | * | 2/1999 | Barrow ........................ 361/777 |
| 5,936,848 A | * | 8/1999 | Mehr et al. .................. 361/777 |
| 6,114,098 A | * | 9/2000 | Appelt et al. ................ 430/315 |
| 6,300,576 B1 | * | 10/2001 | Nakamura et al. .......... 174/261 |

FOREIGN PATENT DOCUMENTS

| | | |
|---|---|---|
| DE | 26 57 313 A | 6/1978 |
| DE | 43 01 705 A | 10/1994 |
| DE | 198 45 901 A | 4/2000 |
| EP | 0 104 565 A | 4/1984 |
| EP | 0 246 489 A | 11/1987 |
| EP | 0 735 808 A | 10/1996 |

* cited by examiner

Primary Examiner—Carl J. Arbes
(74) Attorney, Agent, or Firm—Birch, Stewart, Kolasch & Birch, LLP

(57) ABSTRACT

A method is described for producing an electrical connection between a plug element and a printed circuit board. A plug end of the at least one plug element is inserted in an opening extending through the printed circuit board. A solder, preferably in the form of solder paste, is applied essentially from above to at least parts of the opening or the area surrounding the opening. The connection between the board and the plug end is achieved by melting the solder. Prior to melting of the solder and/or application of the solder, the plug end is introduced into the opening in the printed circuit board essentially from below, and is held therein by a retaining arrangement such that during melting the solder enters the opening from above and contacts the plug end.

18 Claims, 1 Drawing Sheet

METHOD FOR PRODUCING AN ELECTRICAL CONNECTION BETWEEN A PLUG ELEMENT AND A PRINTED CIRCUIT BOARD

This nonprovisional application claims priority under 35 U.S.C. § 119(a) on patent application Ser. No. 101 34 379.5 filed in Germany on Jul. 14, 2001, the entire contents of which are herein incorporated by reference.

BACKGROUND OF THE INVENTION

1. Field of the Invention

The present invention relates to a method for producing an electrical connection between a plug element and a printed circuit board. A plug end of the at least one plug element is inserted in an opening extending through the printed circuit board. A solder, preferably in the form of solder paste, is applied essentially from above to at least parts of the opening or the area surrounding the opening. The connection between the board and the plug end is achieved by melting the solder.

2. Description of the Background Art

A method of the aforementioned type is known from the European unexamined application EP 0 735 808 A1. In the method described therein, solder paste is printed from above onto the throughopening or additionally onto the area surrounding the opening. After that, a connector strip with plug elements is placed on the printed circuit board from above such that each of the plug ends pushes on the printed-on solder paste and presses it into the opening. During this pressing-in process, moreover, the plug end is also introduced into the opening so that ultimately, the plug end is surrounded in the opening by the solder paste. Contact can then be made with the plug end through the solder paste by means of a melting process.

It has proven to be disadvantageous here that additional protective measures must be taken to prevent solder paste from being pushed downward out of the opening by the plug end. In particular, the lower end of the opening must be sealed with solder resist prior to the printing and pressing in of the solder paste. This is, firstly, quite costly to implement for a large number of openings. Secondly, there exists the possibility that despite the solder resist, the pressure produced by pressing in the plug end is so great that the solder resist cracks off explosively, causing the solder paste to come out the bottom of the opening.

SUMMARY OF THE INVENTION

The problem that the present invention proposes to solve is the creation of a method of the aforementioned type which can be performed more simply and more economically.

This is achieved in accordance with the invention in that, prior to melting of the solder and/or application of the solder, the plug end is introduced into the opening in the printed circuit board essentially from below, and is held therein by retaining means such that, during melting, the solder enters into the opening from above and contacts the plug end. In contrast to the above-described background art, it is not necessary in the solution according to the invention to force the solder paste into the opening by means of the plug end. Instead, the solder or the solder paste can penetrate from above during melting and contact the plug end in the process. The use of suitable retaining means can achieve the result that the plug end does not fall downward out of the opening during the application of the solder paste or during melting.

In accordance with a preferred embodiment of the present invention, at least one SMD component is placed on the printed circuit board from above prior to melting of the solder, wherein the melting process that connects the plug end to the printed circuit board also achieves an electrical connection between a contact element of the SMD component and the printed circuit board. In this context, the at least one contact element of the SMD component can be placed from above on the solder that was applied to the printed circuit board. For example, when the solder is a solder paste, it will have a doughy consistency after printing so that the contact element of the SMD component can be placed from above on the solder paste in such a manner that it is held sufficiently well. The aforementioned features of the method result in especially cost-effective production of an electrical circuit, since plug elements and SMD components can be simultaneously connected to the printed circuit board in one melting process.

Provision can be made in accordance with the invention for the retaining means to be provided by edges on the plug end wherein the plug end is wedged in the opening in such a manner that it cannot fall downward out of the opening. With an alternative or additional retention, provision is made for the retaining means to include a base plate, arranged below the printed circuit board, in which the at least one plug element is retained. In this context, the plug element can be retained in the base plate in that it is pressed into an opening in the base plate and in that the at least one plug element extends through the base plate from bottom to top. Each of the aforementioned methods represents a simple-to-implement technique for retaining the plug elements in the desired positions.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow of preferred example embodiments and the accompanying drawings which are given by way of illustration only, and thus, are not limitive of the present invention, and wherein.

DETAILED DESCRIPTION OF THE PREFERRED EMBODIMENTS

Figure 4:
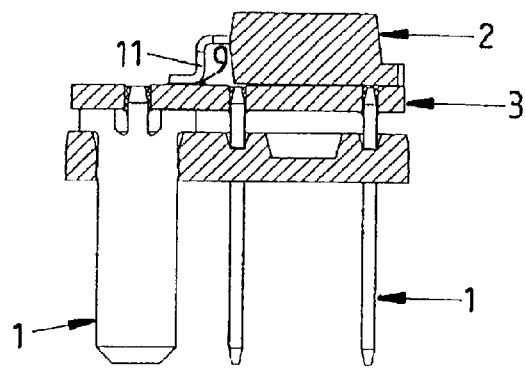
FIG. 4 shows the process step shown in FIG. 3 in the vicinity of an SMD component.

Using a method in accordance with the invention, an arrangement can be produced such as can be seen in FIG. 4, for example. In this arrangement, plug elements 1 and SMD (surface mount device) components 2 are connected to a printed circuit board 3.

Figure 1:
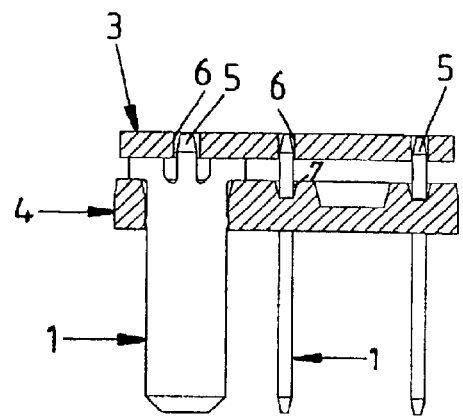
FIG. 1 is a schematic representation of a first process step of a method in accordance with the invention.

A first step of a method in accordance with the invention can be seen in FIG. 1. Here, plug elements 1 with their plug ends 5, which in FIG. 1 point upward, are fixed in place in through-openings 6 in the printed circuit board 3 by means of a base plate 4. The plug ends 5 preferably do not extend upward past the surface of the printed circuit board 3 in this context. The base plate 4 can have through-openings 7 for passage of the plug elements 1. These plug elements 1 can, in particular, be positioned by means of the arrangement of the openings 7 in accordance with the circuit to be implemented, and introduced into the openings 5 of the printed circuit board 3. Fixing of the plug elements 1 in the base plate 4 can, for example, be accomplished by pressing.

In an alternative embodiment of the present invention, the plug ends 5 are wedged into the printed circuit board such that a base plate 4 may not be necessary. In this case, the plug elements 1 are held in the printed circuit board 3 by the wedging such that they cannot slide downward out of the openings 5.

Figure 2:
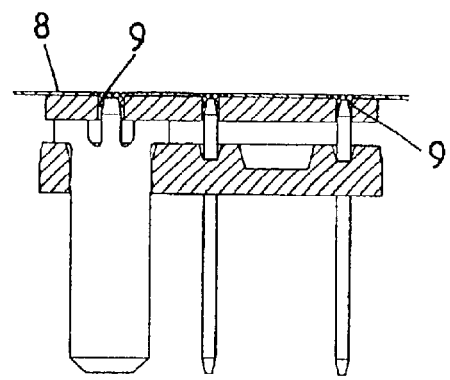
FIG. 2 is a schematic representation of another process step of a method in accordance with the invention.

It can be seen in FIG. 2 that in a second step, a print mask 8, which has openings for passage of solder paste 9 arranged in accordance with the circuit to be implemented, is placed on the top of the printed circuit board 3. By means of the openings in the print mask 8, in a next process step, solder paste can be applied or inserted in targeted fashion to the plug ends 5, or over and into the openings 6.

It can be seen from FIG. 2 that some of the solder paste enters the openings 6 along the sides of the plug ends 5.

Figure 3:
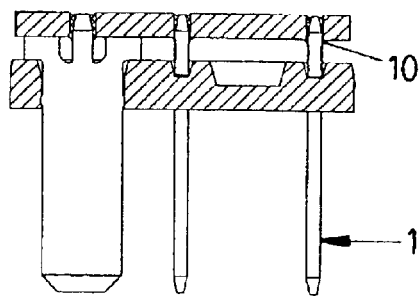
FIG. 3 is a schematic representation of another process step of a method in accordance with the invention.

FIG. 3 and FIG. 4 show the arrangement in accordance with the invention after the solder paste has been melted on. This melting on can be achieved in a suitable oven or by means of hot air, for example. Particularly clearly visible in FIG. 3 and FIG. 4 are solder menisci 10 on the underside of the printed circuit board, which surround the plug elements 1 comparatively uniformly. Hence the solder has completely filled the openings 6 in the printed circuit board after melting such that a solid connection has been created between the plug ends 5 and the printed circuit board 3.

It can be seen in FIG. 4 that SMD components 2 can likewise be connected to the printed circuit board 3 by means of this process. In particular, after printing on of the solder paste 9, an SMD component 2 can be placed on the printed circuit board 3 from above in accordance with the circuit to be produced. In this process, plug ends 5 as well as the SMD component 2 can be soldered to the printed circuit board 3 in accordance with the invention during melting of the solder paste 9. Here, the SMD component 2 has a contact element 11, which can be seen particularly clearly in FIG. 4, that rests at least partially against the printed circuit board 3 and is connected to the printed circuit board 3 by means of solder paste 9 that has melted and solidified once again.

The invention being thus described, it will be obvious that the same may be varied in many ways. Such variations are not to be regarded as a departure from the spirit and scope of the invention, and all such modifications as would be obvious to one skilled in the art are to be included within the scope of the following claims.

What is claimed is:

1. A method for producing an electrical connection between a plug element and a printed circuit board, wherein a plug end to be contacted of the at least one plug element is inserted in an opening extending through the printed circuit board, wherein moreover a solder is applied essentially from above to at least parts of the opening or the area surrounding the opening, wherein the connection between the printed circuit board and the plug end is achieved by melting the solder, and wherein prior to melting of the solder and/or application of the solder, the plug end is introduced into the opening in the printed circuit board essentially from below, and is held therein by retaining means such that during melting the solder enters the opening from above and contacts the plug end; wherein the retaining means include a base plate arranged below the printed circuit board, in which the at least one plug element is retained.

2. The method in accordance with claim 1, wherein at least one surface mount device (SMD) component is placed on the printed circuit board from above prior to melting of the solder, and in that the melting process that connects the plug end to the printed circuit board also achieves an electrical connection between a contact element of the SMD component and the printed circuit board.

3. The method in accordance with claim 2, wherein the at least one contact element of the SMD component is placed from above on the solder that was applied to the printed circuit board.

4. The method in accordance with claim 1, wherein the plug end introduced into the opening from beneath does not extend upward past the opening.

5. The method in accordance with claim 1, wherein the retaining means are provided by edges on the plug end, wherein the plug end is wedged in the opening in such a manner that it cannot fall downward out of the opening.

6. The method in accordance with claim 1, wherein the plug element is pressed into an opening in the base plate.

7. The method in accordance with claim 1, wherein the at least one plug element is connected to the base plate in such a way that the plug element extends through the base plate from bottom to top.

8. The method in accordance with claim 1, wherein the solder is in the form of solder paste.

9. A method for producing an electrical connection between a plug element and a printed circuit board, comprising the following steps in the following order:

inserting a plug end of the at least one plug element into an opening extending through the printed circuit board, the plug end being introduced into the opening in the printed circuit board essentially from below the printed circuit board;

holding the plug end in the opening;

applying a solder essentially from above the printed circuit board to at least parts of the opening or the area surrounding the opening; and achieving the connection between the printed circuit board and the plug end by melting the solder, such that during melting the solder enters the opening from above and contacts the plug end; and further comprising the step of:

providing retaining means for holding the plug end in the opening, wherein the retaining means include a base plate arranged below the printed circuit board, in which the at least one plug element is retained.

10. The method in accordance with claim 9, further comprising the step of:

placing at least one surface mount device (SMD) component on the printed circuit board from above prior to melting of the solder, wherein the melting process that connects the plug end to the printed circuit board also achieves an electrical connection between a contact element of the SMD component and the printed circuit board.

11. The method in accordance with claim 10, wherein the at least one contact element of the SMD component is placed from above on the solder that was applied to the printed circuit board.

12. The method in accordance with claim 9, wherein the plug end introduced into the opening from beneath does not extend upward past the opening.

13. The method in accordance with claim 9, further comprising the step of:

providing retaining means for holding the plug end in the opening, wherein the retaining means are provided by edges on the plug end, and wherein the plug end is wedged in the opening in such a manner that it cannot fall downward out of the opening.

14. The method in accordance with claim 9, wherein the plug element is pressed into an opening in the base plate.

15. The method in accordance with claim 9, wherein the at least one plug element is connected to the base plate in such a way that the plug element extends through the base plate from bottom to top.

16. The method in accordance with claim 9, wherein the solder is in the form of solder paste.

17. The method in accordance with claim 1, wherein the plug end of the at least one plug element is in solid form during insertion into the opening of the printed circuit board.

18. The method in accordance with claim 9, wherein the plug end of the at least one plug element is in solid form during insertion into the opening of the printed circuit board.

* * * * *